United States Patent
Oshima et al.

(10) Patent No.: US 11,904,887 B2
(45) Date of Patent: Feb. 20, 2024

(54) TRAVELING VEHICLE AND TRAVELING VEHICLE SYSTEM

(71) Applicant: MURATA MACHINERY, LTD., Kyoto (JP)

(72) Inventors: Munekuni Oshima, Ise (JP); Taiji Yamashita, Inuyama (JP); Seiji Yamagami, Kyoto (JP)

(73) Assignee: MURATA MACHINERY, LTD., Kyoto (JP)

( * ) Notice: Subject to any disclaimer, the term of this patent is extended or adjusted under 35 U.S.C. 154(b) by 356 days.

(21) Appl. No.: 17/431,445

(22) PCT Filed: Dec. 12, 2019

(86) PCT No.: PCT/JP2019/048812
§ 371 (c)(1),
(2) Date: Aug. 17, 2021

(87) PCT Pub. No.: WO2020/174812
PCT Pub. Date: Sep. 3, 2020

(65) Prior Publication Data
US 2022/0135066 A1  May 5, 2022

(30) Foreign Application Priority Data
Feb. 25, 2019  (JP) ................. 2019-031996

(51) Int. Cl.
| B60W 60/00 | (2020.01) |
| G06V 20/58 | (2022.01) |
| B60W 30/10 | (2006.01) |
| H01L 21/677 | (2006.01) |
| B60W 30/165 | (2020.01) |
| B60W 30/16 | (2020.01) |
| B60W 30/14 | (2006.01) |

(52) U.S. Cl.
CPC .......... *B60W 60/001* (2020.02); *B60W 30/10* (2013.01); *B60W 30/14* (2013.01);
(Continued)

(58) Field of Classification Search
CPC .... G09B 29/00; G08G 1/096811; G08G 1/16; G01C 21/367; G01C 21/3694;
(Continued)

(56) References Cited

U.S. PATENT DOCUMENTS

2021/0016793 A1*  1/2021  Yamaguchi .......... G08G 1/0962

FOREIGN PATENT DOCUMENTS

| CN | 105518556 B | * | 8/2018 | ............ E02F 9/2004 |
| CN | 108885116 B | * | 4/2022 | ............ G01C 21/32 |

(Continued)

OTHER PUBLICATIONS

Official Communication issued in International Patent Application No. PCT/JP2019/048812, dated Sep. 2, 2021.
(Continued)

*Primary Examiner* — Crystal J Barnes-Bullock
(74) *Attorney, Agent, or Firm* — Keating & Bennett, LLP (57) ABSTRACT

A traveling vehicle travels along a traveling path and includes a main body, a traveler to allow a main body to travel along the traveling path, an LED array provided at the main body to switch a display manner according to a state of the traveling vehicle, an imager to capture an image of the LED array at a traveling vehicle located ahead of the traveling vehicle, and a controller configured or programmed to acquire a state of the traveling vehicle ahead based on the display manner captured by the imager, and to control the traveler of the traveling vehicle based on the acquired state.

10 Claims, 6 Drawing Sheets

(52) U.S. Cl.
CPC .......... *B60W 30/16* (2013.01); *B60W 30/165* (2013.01); *B60W 60/0015* (2020.02); *B60W 60/0027* (2020.02); *G06V 20/58* (2022.01); *H01L 21/67715* (2013.01); *H01L 21/67727* (2013.01); *B60W 2420/42* (2013.01)

(58) Field of Classification Search
CPC . G01C 21/3881; B60W 30/10; B60W 60/001; B60W 30/14; B60W 30/16; B60W 30/165; B60W 60/0015; B60W 60/0027
See application file for complete search history.

(56) References Cited

FOREIGN PATENT DOCUMENTS

| | | | |
|---|---|---|---|
| JP | 63-259705 A | | 10/1988 |
| JP | 03-131911 A | | 6/1991 |
| JP | 2001-249718 A | | 9/2001 |
| JP | 2007-025745 A | | 2/2007 |
| JP | 2012-256235 A | | 12/2012 |
| JP | 2016218736 A | * | 12/2016 |
| JP | 2018-136844 A | | 8/2018 |
| JP | 2018163415 A | * | 10/2018 |
| KR | 20170121562 A | * | 11/2017 |

OTHER PUBLICATIONS

English translation of Official Communication issued in International Patent Application No. PCT/JP2019/048812, dated Mar. 10, 2020.

Official Communication issued in corresponding European Patent Application No. 19917218.0, dated Oct. 6, 2022.

Official Communication issued in International Patent Application No. PCT/JP2019/048812, dated Mar. 10, 2020.

* cited by examiner

TRAVELING VEHICLE AND TRAVELING VEHICLE SYSTEM

BACKGROUND OF THE INVENTION

1. Field of the Invention

An aspect of the present invention relates to a traveling vehicle and a traveling vehicle system.

2. Description of the Related Art

A transportation vehicle system (traveling vehicle system) is known in which a plurality of transportation vehicles (traveling vehicles) equipped with forward-looking sensors travel on a predetermined path. For example, Japanese Unexamined Patent Publication No. 2007-25745 discloses a transportation vehicle system that measures the inter-vehicle distance to a preceding transportation vehicle for each transportation vehicle, determines a speed relative to the preceding transportation vehicle based on a change per time of the measured inter-vehicle distance, and controls the speed of the transportation vehicle itself based on the measured inter-vehicle distance.

SUMMARY OF THE INVENTION

In the conventional traveling vehicle system described above, the transportation capability is requested to be increased by traveling with a minimum distance between traveling vehicles (with a shorter inter-vehicle distance). Unfortunately, in the conventional traveling vehicle system, even when the traveling vehicle ahead stops, the traveling vehicle behind does not start stopping operation until the inter-vehicle distance becomes equal to or smaller than a predetermined value, and, therefore, the traveling vehicle behind is unable to stop to follow the stopping of the traveling vehicle ahead instantaneously. In the conventional traveling vehicle system, therefore, it is necessary to provide a margin on the inter-vehicle distance (increase the inter-vehicle distance), and there is a room for improvement for increasing the transportation capability. More specifically, the traveling vehicle behind is requested to promptly perform operation appropriate for the state of the traveling vehicle ahead.

Preferred embodiments of the present invention provide traveling vehicles and traveling vehicle systems each capable of promptly performing operations appropriate for the state of the traveling vehicle ahead.

A traveling vehicle according to an aspect of a preferred embodiment of the present invention travels along a predetermined traveling path. The traveling vehicle includes a main body, a traveler to allow the main body to travel along the traveling path, a display provided at the main body to switch a display manner according to a state of the traveling vehicle, an imager to capture an image of the display provided at a front traveling vehicle located ahead of the traveling vehicle, and a controller configured or programmed to acquire a state of the front traveling vehicle based on the display manner captured by the imager, and to control the traveler of the traveling vehicle based on the acquired state.

In the traveling vehicle with this configuration, since a display manner that varies according to a state of the traveling vehicle is indicated on the display, the traveling vehicle behind that acquires the display manner of the display with the imager can determine a state of the traveling vehicle ahead instantaneously. With this configuration, the traveling vehicle behind can promptly perform operation appropriate for the state of the traveling vehicle ahead.

In a traveling vehicle according to an aspect of a preferred embodiment of the present invention, the display may switch the display manner according to a traveling state of the traveling vehicle, and the traveling state may include an accelerated state and a decelerated state. This configuration enables a traveling vehicle behind to determine at least whether the traveling vehicle itself is in the accelerated state or the decelerated state. With this configuration, when the traveling vehicle ahead accelerates, the traveling vehicle behind can promptly follow the acceleration, and when the traveling vehicle ahead decelerates, the traveling vehicle behind can promptly follow the deceleration.

In a traveling vehicle according to an aspect of a preferred embodiment of the present invention, the display may switch the display manner according to a present location of the traveling vehicle itself. This configuration enables a traveling vehicle behind to determine at least the present location of the traveling vehicle itself. With this configuration, the traveling vehicle behind can accurately determine the positional relation to the traveling vehicle ahead.

In a traveling vehicle according to an aspect of a preferred embodiment of the present invention, the traveling vehicle may further include an identifier at or adjacent to the display. The controller may acquire a state of the front traveling vehicle based on the display manner captured by the imager and a positional relation between the display and the identifier, and may control the traveler of the traveling vehicle based on the acquired state. With this configuration, for example, the possibility that an unintended display (for example, a display that is not provided on the traveling vehicle) is recognized by error can be reduced or, for example, a state of the traveling vehicle ahead can be acquired accurately based on the display captured through the mirror.

A traveling vehicle system according to an aspect of a preferred embodiment of the present invention may include a plurality of the traveling vehicles. In the traveling vehicle system with this configuration, since each individual traveling vehicle can promptly perform operations appropriate for the state of the traveling vehicle ahead, the transportation performance of the traveling vehicle system as a whole is improved.

A traveling vehicle system according to an aspect of a preferred embodiment of the present invention may further include a mirror disposed along the traveling path to reflect the display at the front traveling vehicle. The controller may acquire a state of the front traveling vehicle based on the display manner captured by the imager through the mirror. In this configuration, the range of visibility can be widened because of the mirror interposed, for example, when the traveling vehicle ahead is located beyond a curve section as viewed from the traveling vehicle behind, and the range in which the traveling vehicle ahead is visible is narrow.

According to an aspect of a preferred embodiment of the present invention, operations appropriate for the state of the traveling vehicle ahead can be promptly performed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the drawings. In the description of the drawings, the same elements are denoted by the same reference signs and an overlapping description is omitted.

Figure 1:
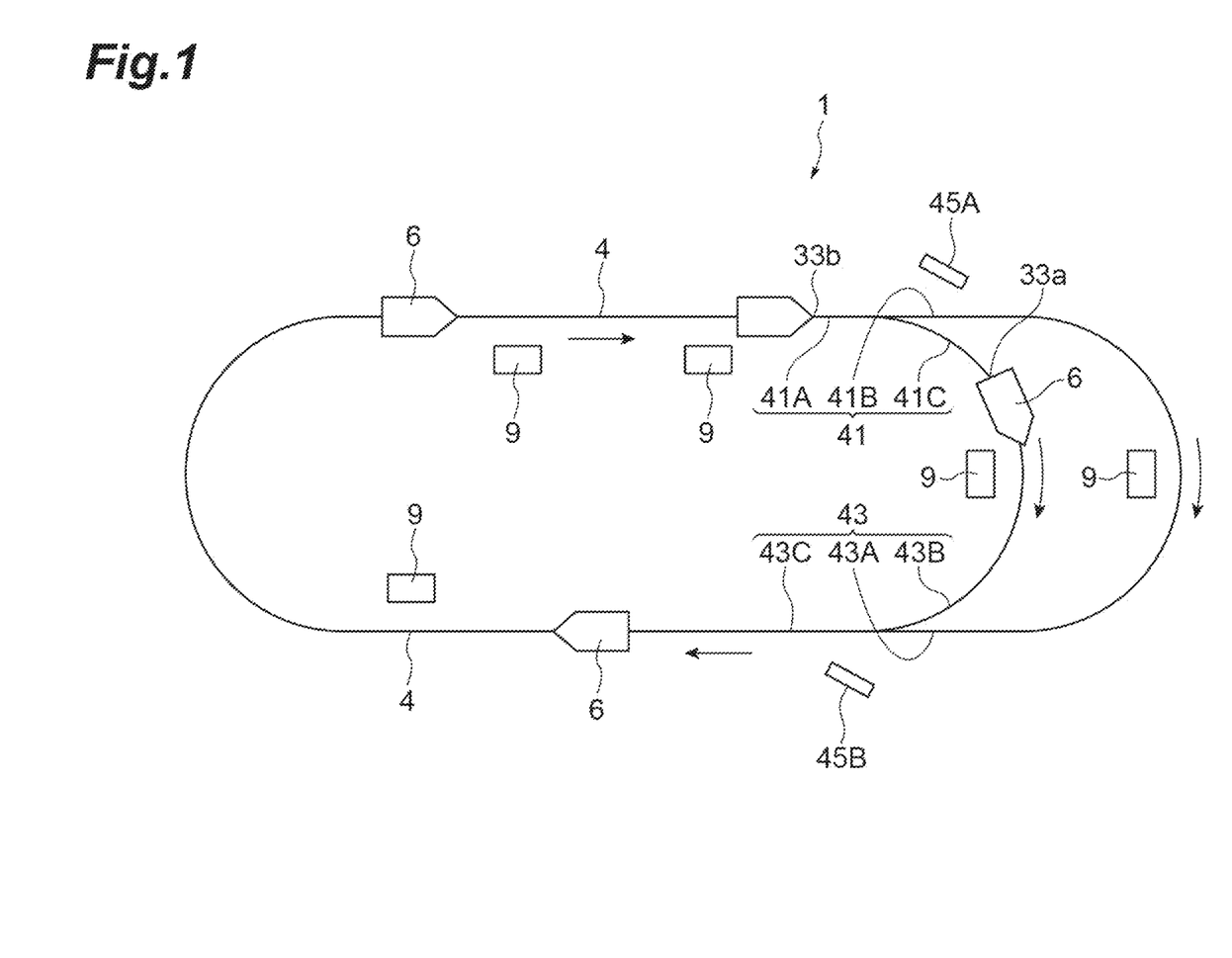
FIG. 1 is a schematic plan view illustrating a traveling vehicle system according to a preferred embodiment of the present invention.

A traveling vehicle system 1 is, for example, a system for transporting an article 10 (see FIG. 2) between placement sections 9 and 9 using an overhead traveling vehicle 6 movable along a track (a predetermined traveling path) 4. Examples of the article 10 include containers such as a front opening unified pod (FOUP) storing a plurality of semiconductor wafers and a reticle pod storing a glass substrate, and common parts. Here, for example, the traveling vehicle system 1 in a factory is taken as an example, in which the overhead traveling vehicle 6 (hereinafter simply referred to as "traveling vehicle 6") travels along the one-way track 4 laid on the ceiling in the factory. As illustrated in FIG. 1, the traveling vehicle system 1 includes the track 4, mirrors 45A and 45B, a plurality of traveling vehicles 6, and a plurality of placement sections 9.

Figure 2:
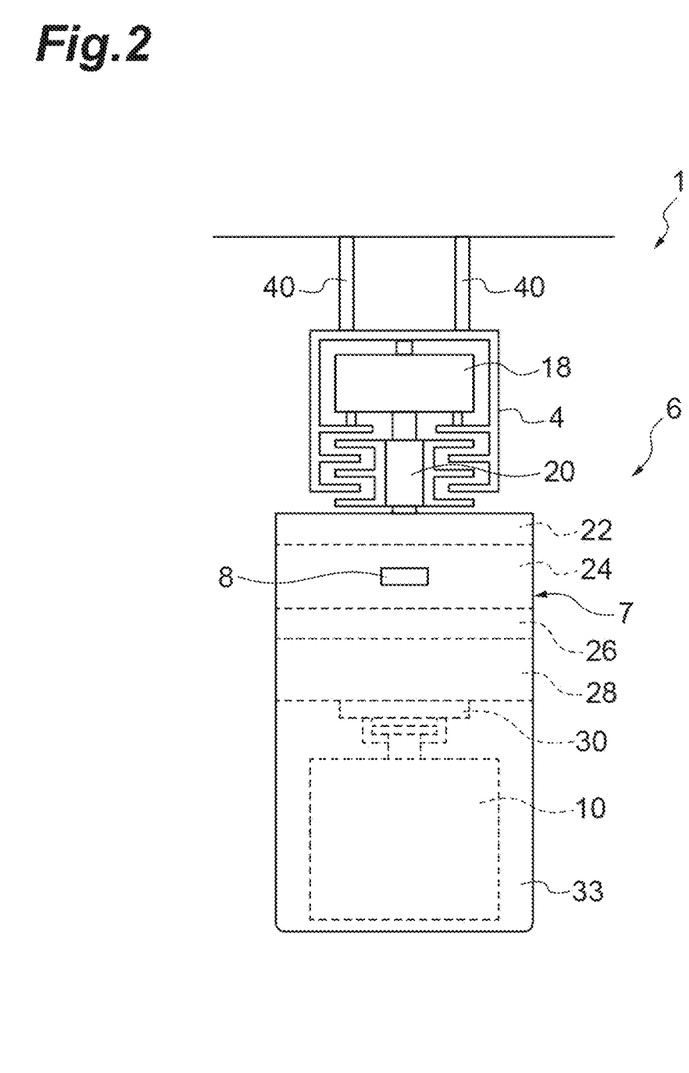
FIG. 2 is a front diagram of an overhead traveling vehicle in FIG. 1.

As illustrated in FIG. 2, the track 4 is laid, for example, in the vicinity of the ceiling that is a space above the worker's head. The track 4 is, for example, suspended from the ceiling. The track 4 is a predetermined traveling path for the traveling vehicles 6 to travel. The track 4 is supported by struts 40 and 40.

As illustrated in FIG. 1, the mirrors 45A and 45B (for example, wide-angle mirrors) are provided along the track 4 and reflect a light emitting diode (LED) array (display unit) 55 (see FIG. 3) provided on the traveling vehicle 6. The track 4 includes a branching section 41 including an incoming path 41A that comes into a predetermined location along one direction, a first outgoing path 41B that goes out from the predetermined location along the one direction, and a second outgoing path 41C that goes out from the predetermined location in a direction different from the one direction. The mirror 45A is arranged near (to the side of) the branching section 41. The mirror 45A reflects the LED array 55 provided at a drop-preventing cover 33a of a traveling vehicle 6 ahead (front traveling vehicle) as viewed from one traveling vehicle 6. The track 4 also includes a merging section 43 including a first incoming path 43A that comes into a predetermined location along one direction, a second incoming path 43B that comes into the predetermined location from a direction different from the one direction, and an outgoing path 43C that goes out from the predetermined location in a direction different from the one direction. The mirror 45B is arranged near the merging section 43. The mirror 45B reflects the LED array 55 provided at a drop-preventing cover 33b of a traveling vehicle 6 ahead (front traveling vehicle) as viewed from one traveling vehicle 6.

Figure 3:
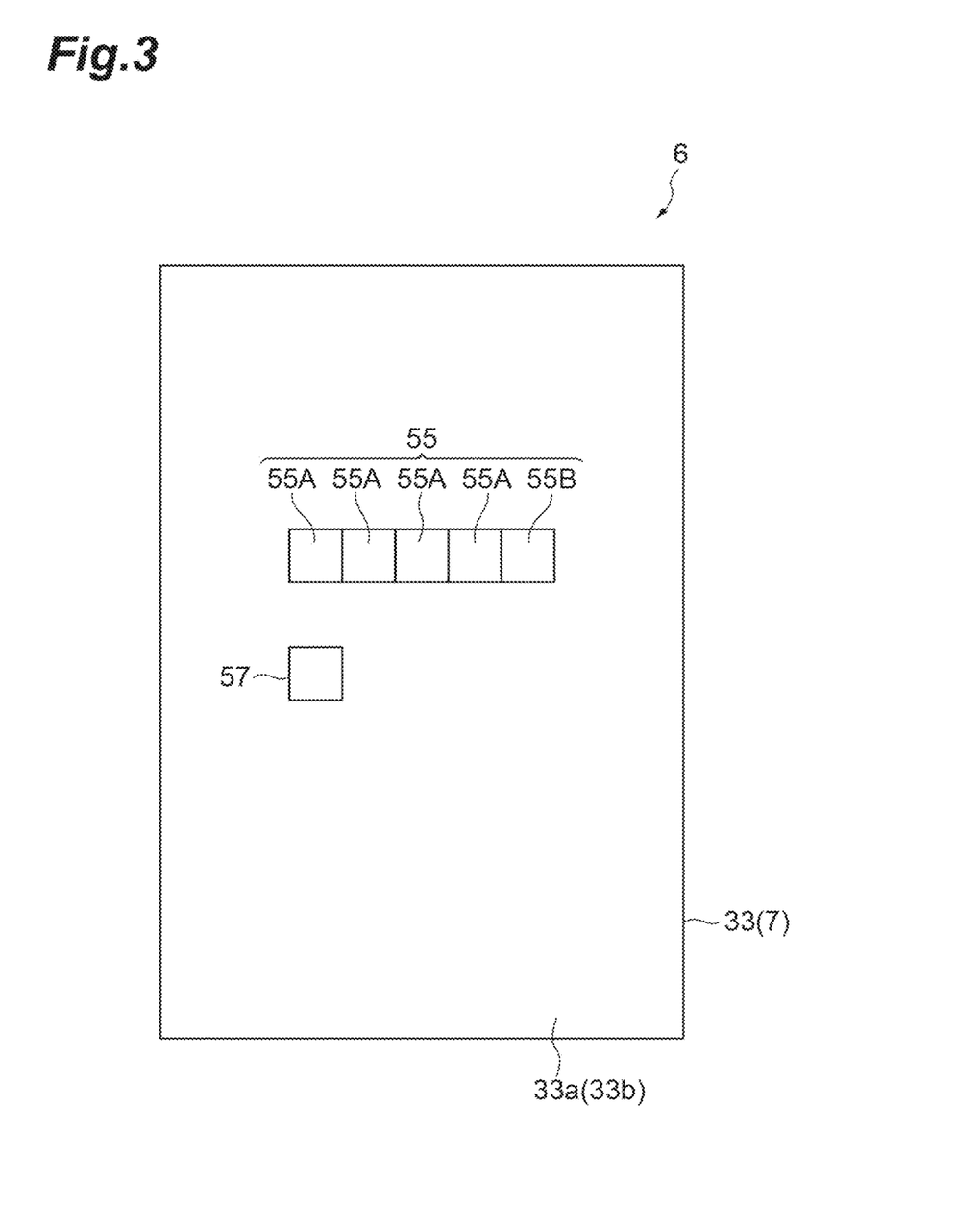
FIG. 3 is a rear view of a main body of the overhead traveling vehicle in FIG. 1.

The traveling vehicle 6 travels along the track 4 and transports the article 10. The traveling vehicle 6 is configured to transfer the article 10. The traveling vehicle 6 is an automated overhead transportation vehicle. The number of traveling vehicles 6 included in the traveling vehicle system 1 is not limited and is more than one. As illustrated in FIG. 2 and FIG. 3, the traveling vehicle 6 includes a main body 7, a traveling unit 18, an LED array 55, an identifier (first identifier and second identifier) 57, an imager 8, and a controller 50.

The main body 7 includes a main body frame 22, a traverse unit 24, a θ drive 26, an elevation driver 28, an elevation stage 30, and a drop-preventing cover 33. The traveling unit 18 includes a motor and allows the traveling vehicle 6 to travel along the track 4. The traveling unit 18 includes, for example, a power-receiving communication unit 20 that receives power from the track 4 via wireless charging.

The traverse unit 24 allows the θ drive 26, the elevation driver 28, and the elevation stage 30 to collectively traverse in a direction normal to the traveling direction of the track 4. The θ drive 26 turns at least one of the elevation driver 28 and the elevation stage 30 within a predetermined angle range in a horizontal plane. The elevation driver 28 lifts and lowers the elevation stage 30 by reeling or unreeling a suspension member such as wire, rope, and belt. The elevation stage 30 includes a chuck and can grip or release the article 10. A pair of drop-preventing covers 33 are provided, for example, at the front and the rear in the traveling direction of the traveling vehicle 6. The drop-preventing covers 33 provide a not-illustrated pawl below the article 10 to be transported and prevent the article 10 from dropping during transportation.

As illustrated in FIG. 1 and FIG. 2, the placement sections 9 are arranged along the track 4 and provided at locations where the article 10 can be delivered to/from the traveling vehicle 6. The placement sections 9 include a buffer and a delivery port. The buffer is a placement section on which the article 10 is temporarily placed. The buffer is a placement section on which the article 10 is temporarily placed when the article 10 transported by the traveling vehicle 6 is unable to be transferred to a target delivery port, for example, for the reason that another article 10 has been placed on the target delivery port. The delivery port is, for example, a placement section for delivering the article 10 to/from a semiconductor processing device (not illustrated) such as a cleaning device, a deposition device, a lithography device, an etching device, a thermal treatment device, and a planarization device. The processing device is not limited to a specific device and may be a variety of devices.

For example, the placement sections 9 are arranged to the side of the track 4. In this case, the traveling vehicle 6 allows the traverse unit 24 to traverse the elevation driver 28 and the like and slightly lifts and lowers the elevation stage 30 to deliver the article 10 to/from the placement section 9. Although not illustrated, the placement sections 9 may be arranged immediately below the track 4. In this case, the traveling vehicle 6 lifts and lowers the elevation stage 30 to deliver the article 10 to/from the placement section 9.

As illustrated in FIG. 3, the LED array 55 is arranged at the drop-preventing cover 33a (33) provided on the rear side of the traveling vehicle 6. The LED array 55 may be additionally arranged on the drop-preventing cover 33b (33) provided on the front side of the traveling vehicle 6. The LED array 55 includes an array of a plurality of (five) LEDs 55A and 55B. The LED array 55 switches a display manner according to a state of the traveling vehicle 6 itself (the traveling vehicle 6 including the LED array 55).

Specifically, the LED array 55 changes a display manner with a combination of an illuminated LED 55A and a not-illuminated LED 55A among four LEDs 55A (hereinafter simply referred to as "combination of illumination"). The remaining one LED 55B is used as a parity. That is, it is used to determine whether a combination of illumination of four LEDs 55A is the display manner intended by the controller 50. The switching of display manners in the LED array 55 is performed by the controller 50.

The identifier 57 is arranged near (adjacent to) the LED array 55. The identifier 57 is a predetermined symbol (mark). The identifier 57 may be, for example, a two-dimensional barcode or may include information such as an identification number for identifying each of a plurality of traveling vehicles 6.

The imager 8 captures an image of the LED array 55 provided on a traveling vehicle 6 located ahead of the traveling vehicle 6 itself. The imager 8 is arranged on the drop-preventing cover 33b (33) provided on the front side of the traveling vehicle 6. The imager 8 transmits a captured image obtained by capturing a display manner of the LED array 55 to the controller 50. As described later, the imager 8 not only captures an image of the LED array 55 provided on a traveling vehicle 6 located ahead of the traveling vehicle 6 itself but also captures an image of the LED array 55 reflected on the mirrors 45A and 45B arranged along the track 4.

Figure 4:
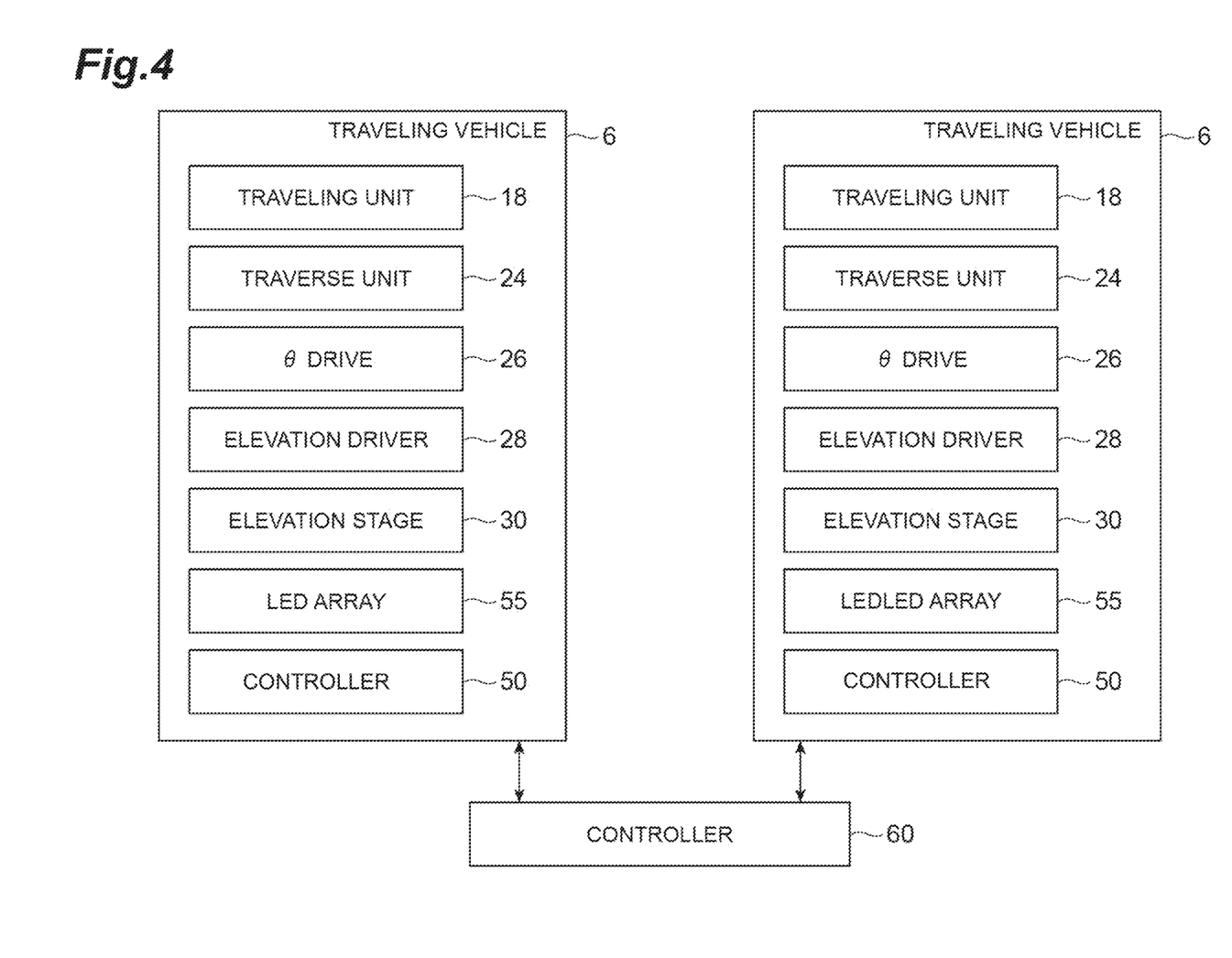
FIG. 4 is a block diagram illustrating a functional configuration of the traveling vehicle system in FIG. 1.

The controller 50 is an electronic control unit including a central processing unit (CPU), a read only memory (ROM), and a random access memory (RAM). The controller 50 is configured or programmed to control various operations in the traveling vehicle 6. Specifically, as illustrated in FIG. 4, the controller 50 is configured or programmed to control the traveling unit 18, the traverse unit 24, the θ drive 26, the elevation driver 28, the elevation stage 30, and the LED array 55. The controller 50 can be configured, for example, as software that is a program stored in the ROM, loaded into the RAM, and executed by the CPU. The controller 50 may be configured as hardware with electronic circuitry, for example. The controller 50 communicates with a controller 60 using a communication line (feeder line) of the track 4.

The controller 50 switches a display manner of the LED array 55 according to a traveling state of the traveling vehicle 6 itself. Specifically, for example, when receiving a command from the controller 60 and determining that the traveling state of the traveling vehicle 6 itself becomes an acceleration state or a deceleration state, the controller 50 controls illumination of the LEDs 55A in the LED array 55 to attain a display manner corresponding to the acquired traveling state. In other words, the controller 50 transmits the traveling state of the traveling vehicle 6 itself to a traveling vehicle 6 behind by switching a display manner of the LED array 55 provided on the traveling vehicle 6. The controller 50 also switches a display manner of the LED array 55 according to the present location of the traveling vehicle 6 itself. Specifically, the controller 50, for example, acquires the traveling location of the traveling vehicle 6 itself by reading information such as a barcode attached to the track 4 and then controls illumination of the LEDs 55A in the LED array 55 to attain a display manner corresponding to the acquired traveling location. In other words, the controller 50 transmits the traveling location of the traveling vehicle 6 itself to a traveling vehicle 6 behind by switching a display manner of the LED array 55 provided on the traveling vehicle 6.

The controller 50 acquires a state of a traveling vehicle 6 ahead based on the display manner captured by the imager 8 or the display manner captured by the imager 8 through the mirrors 45A and 45B and controls the traveling unit 18 of the traveling vehicle 6 itself based on the acquired state. Specifically, the controller 50 acquires a state of a traveling vehicle 6 located ahead, based on the manner of the LED array 55 of the traveling vehicle 6 located ahead that is captured by the imager 8. The controller 50, for example, extracts a combination of illumination of the LED array 55 from the acquired captured image and refers to combination information in which the states of the traveling vehicle 6 and the combinations of illumination are mapped and stored. The controller 50 thus acquires the state of the traveling vehicle 6 ahead.

The controller 50 controls the traveling unit 18 in accordance with the acquired state of the traveling vehicle 6 ahead. Specifically, the controller 50 decelerates the traveling unit 18 of the traveling vehicle 6 itself when acquiring that the traveling state of the traveling vehicle 6 ahead is the decelerated state. Furthermore, the controller 50 accelerates the traveling unit 18 of the traveling vehicle 6 itself when acquiring that the traveling state of the traveling vehicle 6 ahead is the accelerated state.

The controller 50 determines whether to control the traveling unit 18, based on the positional relation between the LED array 55 and the identifier 57 in the captured image acquired by the imager 8. For example, when the identifier 57 is recognized at a predetermined position relative to the LED array 55 (for example, the lower left to the LED array 55) in the captured image, the controller 50 acquires a state of the traveling vehicle 6 ahead from the acquired captured image and controls the traveling unit 18 in accordance with the acquired state. On the other hand, when the identifier 57 is not recognized at a predetermined position relative to the LED array 55 in the captured image, the controller 50 does not control the traveling unit 18 based on the acquired captured image. In other words, the controller 50 determines that the acquired display manner is not the one acquired from the LED array 55 provided on the traveling vehicle 6 ahead, and does not control the traveling unit 18.

The controller 50 also determines whether the display manner is a mirror image reflected on the mirrors 45A and 45B, based on the positional relation between the LED array 55 and the identifier 57 in the captured image acquired by the imager 8. For example, when the identifier 57 is recognized at a predetermined position relative to the LED array 55 (for example, the lower right to the LED array 55) in the captured image, the controller 50 determines that it is the captured image (mirror image) in which the LED array 55 of the traveling vehicle 6 ahead is captured, not through the mirrors 45A and 45B. On the other hand, when the identifier 57 is not recognized at a predetermined position relative to the LED array 55 in the captured image, the controller 50 determines that it is the captured image (mirror image) acquired through the mirrors 45A and 45B. The controller 50 thus can determine whether the acquired combination of illumination of the LED array 55 is the one reflected on the mirrors 45A and 45B.

The controller 60 is an electronic control unit including a central processing unit (CPU), a read only memory (ROM), and a random access memory (RAM). The controller 60 can be configured, for example, as software that is a program stored in the ROM, loaded into the RAM, and executed by the CPU. The controller 60 may be configured as hardware with electronic circuitry, for example. The controller 60 transmits a transportation command to the traveling vehicle 6 to transport the article 10.

The operation of the traveling vehicle system 1 in the present preferred embodiment will now be described with the following cases as examples:

(1) when the traveling vehicle 6 ahead decelerates,
(2) when the traveling vehicle 6 ahead accelerates,
(3) when the traveling vehicle 6 ahead branches from a branching section, and
(4) when the traveling vehicle 6 ahead merges into a merging section.

(1) When the Traveling Vehicle 6 Ahead Decelerates

For example, a case where the traveling vehicle 6 ahead suddenly stops for some reason will be described as an example. The traveling vehicle 6 is monitoring the distance to an obstacle (including a traveling vehicle) ahead, for example, with an obstacle sensor for monitoring a view ahead. In a conventional traveling vehicle system, a traveling vehicle ahead decelerates when the distance to an obstacle ahead is a predetermined distance and stops when the distance to the obstacle ahead is a second predetermined distance shorter than the previous predetermined distance. Similarly, a traveling vehicle behind decelerates when the distance to the traveling vehicle ahead is a predetermined distance and stops when the distance to the traveling vehicle ahead is a second predetermined distance shorter than the predetermined distance. In such a conventional traveling vehicle system, for example, even when the traveling vehicle ahead starts deceleration, the traveling vehicle behind is unable to decelerate until the traveling vehicle behind approaches a predetermined distance. The traveling vehicle behind therefore is unable to start deceleration immediately at the timing when the traveling vehicle ahead starts deceleration. The traveling vehicle behind therefore need to travel with the inter-vehicle distance kept relatively longer in order to avoid collision with the traveling vehicle ahead, leading to reduction in transportation capability.

Compared with such a conventional traveling vehicle system, in the traveling vehicle system 1 described above, the traveling vehicle 6 ahead decelerates when the distance to the traveling vehicle 6 ahead is a predetermined distance and simultaneously indicates that the state of the traveling vehicle 6 itself is the decelerated state on the LED array 55. The traveling vehicle 6 behind determines a state of the traveling vehicle 6 ahead based on the combination of illumination of the LED array 55 that is captured by the imager 8. The traveling vehicle 6 behind then starts deceleration immediately when it is determined that the traveling vehicle 6 ahead becomes the decelerated state. In other words, the traveling vehicle 6 behind can start deceleration immediately at the timing when the traveling vehicle 6 ahead starts deceleration. The traveling vehicle 6 behind therefore only need to keep the minimum inter-vehicle distance for avoiding collision with the traveling vehicle 6 ahead, leading to improvement in transportation capability.

(2) When the Traveling Vehicle 6 Ahead Accelerates

For example, a case where a start command is transmitted from the controller 60 simultaneously to the traveling vehicle 6 ahead and the traveling vehicle 6 behind will be described as an example. The traveling vehicle 6 is monitoring the distance to an obstacle ahead, for example, with an obstacle sensor for monitoring a view ahead. In such a case, in the conventional traveling vehicle system, first, the traveling vehicle ahead confirms that there is no obstacle using an obstacle sensor or the like and thereafter accelerates (starts). The traveling vehicle behind accelerates when the distance to the traveling vehicle ahead is equal to or longer than a predetermined distance. In such a conventional traveling vehicle system, the traveling vehicle behind is unable to start acceleration immediately at the timing when the traveling vehicle ahead starts acceleration, for example, because although the traveling vehicle 6 ahead accelerates, there is a waiting time until the traveling vehicle 6 ahead moves away to a predetermined distance from the traveling vehicle behind. The operating rate of the traveling vehicle behind therefore decreases by the waiting time, leading to reduction in transportation capability.

Compared with such a conventional traveling vehicle system, in the traveling vehicle system described above, the traveling vehicle 6 ahead indicates that the state of the traveling vehicle 6 itself is the accelerated state on the LED array 55, simultaneously when starting acceleration. The traveling vehicle 6 behind determines a state of the traveling vehicle 6 ahead based on the combination of illumination of LED array 55 that is captured by the imager 8. The traveling vehicle 6 behind then starts acceleration immediately when it is determined that the traveling vehicle 6 ahead becomes the accelerated state. In other words, the traveling vehicle 6 behind can start acceleration immediately at the timing when the traveling vehicle 6 ahead starts acceleration. The operating rate of the traveling vehicle behind therefore can be increased, leading to improvement in transportation capability.

(3) When the Traveling Vehicle 6 Branches from a Branching Section

Figure 5:
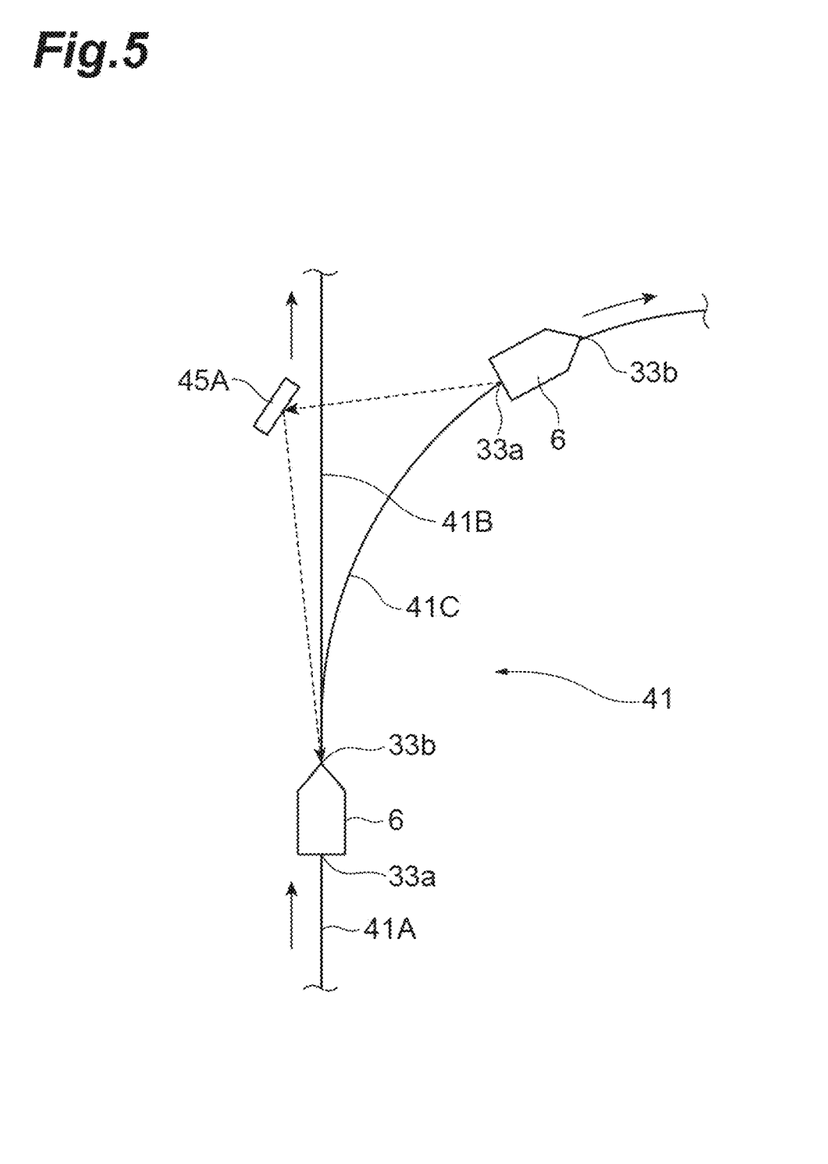
FIG. 5 is an illustration for explaining operation of the traveling vehicle system at a branching section.

For example, as illustrated in FIG. 5, a case where the traveling vehicle 6 ahead takes the second outgoing path 41C and the traveling vehicle 6 behind is due to take the first outgoing path 41B at the branching section 41 will be described as an example. The traveling vehicle 6 is monitoring the distance to an obstacle ahead, for example, with an obstacle sensor for monitoring a view ahead. Such an obstacle sensor often detects the traveling vehicle 6 ahead even when the traveling vehicle entering the second outgoing path 41C is located at a place where it does not collide with the traveling vehicle 6 behind entering the first outgoing path 41B. In the conventional method that controls whether to permit entry at the branching section 41 based on the presence or absence of detection by the obstacle sensor, entry of the traveling vehicle 6 behind into the branching section 41 is restricted as a consequence, leading to a reduction in transportation capability.

Compared with such a conventional traveling vehicle system, in the traveling vehicle system 1 described above, the traveling vehicle 6 ahead acquires the location in the track 4 from a barcode (barcode indicates the location) affixed along the track 4 and indicates the acquired barcode information on the LED array 55. The traveling vehicle 6 behind acquires the location of the traveling vehicle 6 ahead based on the combination of illumination of the LED array 55 that is captured by the imager 8. However, it is difficult for the imager 8 provided at the drop-preventing cover 33b on the front side of the traveling vehicle 6 behind to capture an image of the LED array 55 of the traveling vehicle 6 ahead that deviates to the side.

Then, in the traveling vehicle system 1 described above, the imager 8 of the traveling vehicle 6 behind captures an image of the LED array 55 of the traveling vehicle 6 ahead that is reflected on the mirror 45A provided at the branching section 41. The traveling vehicle 6 behind acquires the location of the traveling vehicle 6 ahead based on the combination of illumination of the LED array 55 that is captured by the imager 8. The traveling vehicle 6 behind can enter the branching section 41 at the point of time when it is determined that the traveling vehicle 6 ahead has moved to a location where it does not collide with the traveling vehicle 6 behind. The unnecessary waiting time otherwise caused at the branching section 41 therefore can be eliminated so as to increase the operating rate and leading to improvement in transportation capability.

(4) When the Traveling Vehicle 6 Ahead Merges into a Merging Section

Figure 6:
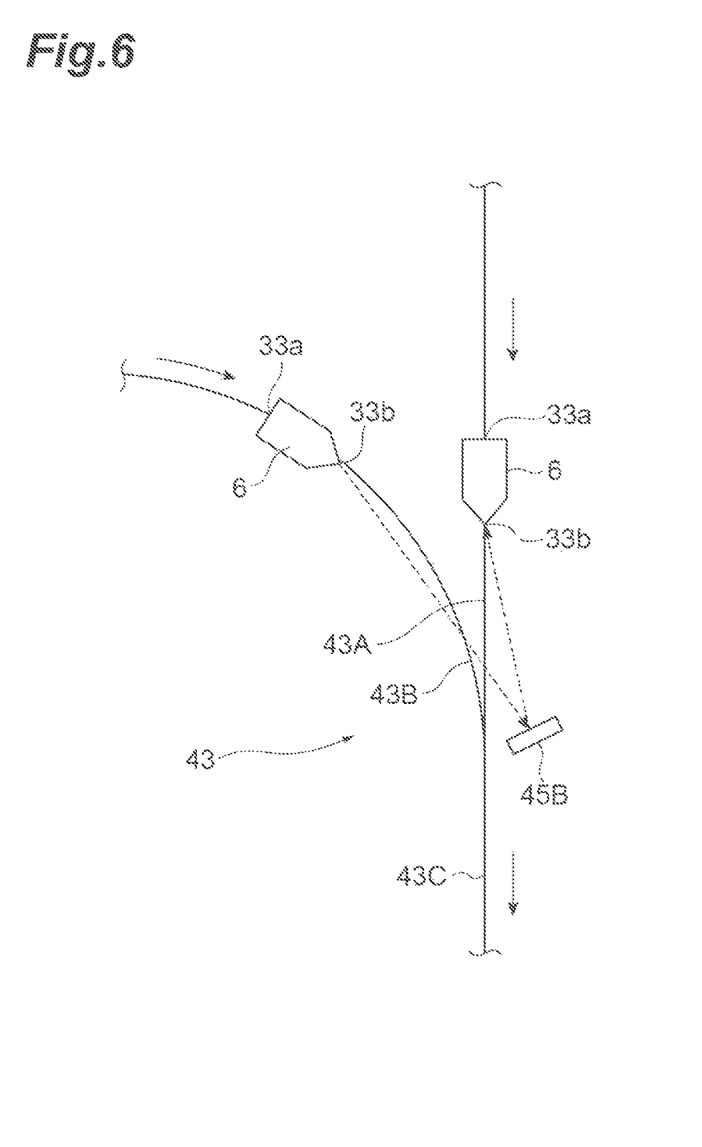
FIG. 6 is an illustration for explaining operation of the traveling vehicle system at a merging section.

For example, as illustrated in FIG. 6, a case where the traveling vehicle 6 ahead takes the first incoming path 43A and the traveling vehicle 6 behind takes the second incoming path 43B at the merging section 43 will be described as an example. The traveling vehicle 6 is monitoring the distance to an obstacle ahead, for example, with an obstacle sensor for monitoring a view ahead. Even when the traveling vehicle 6 stops at a location where it does not collide with the traveling vehicle 6 entering from the second incoming path 43B in the first incoming path 43A, the obstacle sensor provided on the traveling vehicle 6 entering from the second incoming path 43B often detects the traveling vehicle stopping at the first incoming path 43A as the traveling vehicle 6 ahead. In the conventional method that controls whether to permit entry at the merging section 43 based on the presence or absence of detection by the obstacle sensor, entry of the traveling vehicle 6 behind into the merging section 43 is restricted as a consequence, leading to reduction in transportation capability.

Compared with such a conventional traveling vehicle system, in the traveling vehicle system 1 described above, the traveling vehicle 6 ahead acquires the location in the track 4 from a barcode affixed along the track 4 and indicates the acquired barcode information on the LED array 55. The traveling vehicle 6 behind acquires the location of the traveling vehicle 6 ahead based on the combination of illumination of the LED array 55 that is captured by the imager 8. However, it is difficult for the imager 8 provided at the drop-preventing cover 33b, on the front side of the traveling vehicle 6 behind to capture an image of the LED array 55 of the traveling vehicle 6 ahead of the traveling vehicle 6 behind entering from the side.

Then, in the traveling vehicle system 1 described above, the imager 8 of the traveling vehicle 6 behind captures an image of the LED array 55 provided at the drop-preventing cover 33b on the front side of the traveling vehicle 6 ahead that is reflected on the mirror 45B provided at the merging section 43. The traveling vehicle 6 behind acquires the location of the traveling vehicle 6 ahead based on the combination of illumination of the LED array 55 that is captured by the imager 8. The traveling vehicle 6 behind can enter the merging section 43 when it is determined that the traveling vehicle 6 ahead is stopping at a location where it does not collide with the traveling vehicle 6 behind. The unnecessary waiting time otherwise caused at the merging section 43 can be eliminated so as to increase the operating rate and leading to improvement in transportation capability.

A state of the traveling vehicle 6 ahead may be acquired through the LED array 55 by a method using wireless radio waves, a method using infrared communication, and a method using a wireless feeder. However, the method in the present preferred embodiment is advantageous over the method using wireless radio waves in that communication failure is less likely to occur and communication failure due to a change in communication environment over time is less likely to occur. The method in the present preferred embodiment is also advantageous over the method using infrared communication in that it is immune to deviation of the optical axis. The method in the present preferred embodiment is also advantageous over the method using a wireless feeder in that a signal transmission response is fast (latency is short).

A 3D sensor may be provided instead of the method of acquiring the location of the traveling vehicle 6 by acquiring the display manner of the LED array 55 provided on the traveling vehicle 6 ahead through the mirrors 45A and 45B with the imager 8. However, compared with the method using a 3D sensor, the method in the present preferred embodiment can reduce the possibility that the traveling vehicle 6 ahead is hidden behind a structure (rack, post, etc.) and becomes out of sight.

The operation effects of the traveling vehicle system 1 in the foregoing preferred embodiment will now be described. In the traveling vehicle 6 and the traveling vehicle system 1 in the foregoing preferred embodiment, since a display manner that varies according to a state of the traveling vehicle 6 (a display manner according to a state of the traveling vehicle 6) is indicated on the LED array 55, the traveling vehicle 6 behind that acquires the display manner of the LED array 55 with the imager 8 can determine a state of the traveling vehicle 6 ahead instantaneously. With this configuration, the traveling vehicle 6 behind can promptly perform operation appropriate for the state of the traveling vehicle 6 ahead.

The traveling vehicle 6 and the traveling vehicle system 1 in the foregoing preferred embodiment enables the traveling vehicle 6 behind to determine whether the traveling vehicle 6 itself is in the accelerated state or the decelerated state. With this configuration, when the traveling vehicle 6 ahead accelerates, the traveling vehicle 6 behind can promptly follow the acceleration, and when the traveling vehicle 6 ahead decelerates, the traveling vehicle 6 behind can promptly follow the deceleration.

The traveling vehicle 6 and the traveling vehicle system 1 in the foregoing preferred embodiment enable the traveling vehicle 6 behind to determine the traveling location of the traveling vehicle 6 itself. With this configuration, the traveling vehicle 6 behind can accurately determine the positional relation to the traveling vehicle 6 ahead. As a result, for example, the distance to the traveling vehicle 6 ahead can be acquired with high precision, or when the traveling vehicle 6 behind moves, the traveling vehicle 6 can determine with high precision that it will not collide with the traveling vehicle 6 ahead.

In the traveling vehicle 6 and the traveling vehicle system 1 in the foregoing preferred embodiment, the controller 50 acquires a state of the traveling vehicle 6 ahead, based on the display manner captured by the imager 8 and the positional relation between the LED array 55 and the identifier 57. With this configuration, for example, the possibility that an unintended LED array (not provided on the traveling vehicle 6) is recognized by error can be reduced or minimized. When the identifier 57 is arranged at a position shifted from the center in the array direction of the LEDs 55A in the LED array 55, it can be determined whether the captured image captured by the imager 8 is a mirror image. Thus, the number of display manners can be increased with a simple configuration.

In the traveling vehicle system 1 in the foregoing preferred embodiment, since each individual traveling vehicle 6 can promptly perform operation appropriate for the state of the traveling vehicle 6 ahead, the transportation performance of the traveling vehicle system 1 as a whole can be increased.

In the traveling vehicle system 1 in the foregoing preferred embodiment, since the mirrors 45A and 45B are installed, the range of visibility can be increased through the mirrors 45A and 45B, for example, when the traveling vehicle 6 ahead is located beyond a curve section as viewed from the traveling vehicle 6 behind, and the range of visibility of the traveling vehicle 6 ahead is narrow.

Although aspects and preferred embodiments of the present invention have been described above, the aspects and preferred embodiments of the present invention are not limited to the foregoing aspects and preferred embodiments and are amenable to various modifications without departing from the spirit of the present invention.

In the foregoing preferred embodiments, an example in which the LED array 55 is included in the display unit that switches a display manner according to the state of the traveling vehicle itself has been described. However, the present invention is not limited thereto. For example, a liquid crystal display screen may be included, and display contents (color, pattern, symbol, character, etc.) may be changed according to the state of the traveling vehicle itself. Alternatively, an illumination device that simply switches colors to be displayed (emitted) may be included.

In the foregoing preferred embodiments and modifications, an example in which a display manner corresponding to the location of the traveling vehicle 6 is reflected on the mirrors 54A and 54B has been described. However, for example, a display manner corresponding to the traveling state (the accelerated state and the decelerated state) of the traveling vehicle 6 may be reflected through communication means. An example in which the mirrors 54A and 54B are installed at the branching section 41 and the merging section 43 has been described. However, they may be installed, for example, at a curve section. Also in this case, the range in which the traveling vehicle 6 ahead is visible can be widened.

In the foregoing preferred embodiments and modifications, an example in which the controller 50 controlling the traveling vehicle 6 is provided in the main body 7 of each individual traveling vehicle 6 has been described. However, the controller 50 may be separate from the main body 7 and arranged at a location where it can communicate by wire or by radio. In such a case, the controller 50 may be provided as a controller that collectively controls a plurality of traveling vehicles 6, rather than being provided corresponding to each of a plurality of traveling vehicles 6. The controller 50 then may control the display unit (for example, the LED array 55) provided for each individual traveling vehicle 6 so as to switch a display manner of each display unit according to the state (for example, traveling state) of the corresponding traveling vehicle 6.

In the traveling vehicle system 1 in the foregoing preferred embodiments and modifications, overhead traveling vehicles have been described as an example of the traveling vehicles. However, other examples of the traveling vehicles include unmanned traveling vehicles and stacker cranes traveling on a track installed on the ground or a rack.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A traveling vehicle that travels along a predetermined traveling path, the traveling vehicle comprising:
a main body;
a traveler to allow the main body to travel along the traveling path;
a display located at the main body to switch a display manner according to a state of the traveling vehicle;
an imager to capture an image of the display provided at a front traveling vehicle located ahead of the traveling vehicle; and
a controller configured or programmed to acquire a state of the front traveling vehicle based on the display manner captured by the imager, and to control the traveler of the traveling vehicle based on the acquired state; wherein
the display switches the display manner according to a traveling state of the traveling vehicle; and
the traveling state includes an accelerated state and a decelerated state.

2. The traveling vehicle according to claim 1, wherein the display switches the display manner according to a present location of the traveling vehicle.

3. The traveling vehicle according to claim 2, wherein
the traveling vehicle further includes an identifier disposed at or adjacent to the display; and
the controller is configured or programmed to acquire a state of the front traveling vehicle based on the display manner captured by the imager and a positional relation between the display and the identifier, and to control the traveler of the traveling vehicle based on the acquired state.

4. A traveling vehicle system comprising a plurality of the traveling vehicles according to claim 2.

5. The traveling vehicle system according to claim 4, further comprising a mirror located along the traveling path to reflect the display disposed at the front traveling vehicle; wherein
the controller is configured or programmed to acquire a state of the front traveling vehicle based on the display manner captured by the imager through the mirror.

6. The traveling vehicle according to claim 1, wherein
the traveling vehicle further includes an identifier disposed at or adjacent to the display; and
the controller is configured or programmed to acquire a state of the front traveling vehicle based on the display manner captured by the imager and a positional relation between the display and the identifier, and to control the traveler of the traveling vehicle based on the acquired state.

7. A traveling vehicle system comprising a plurality of the traveling vehicles according to claim 6.

8. The traveling vehicle system according to claim 7, further comprising a mirror located along the traveling path to reflect the display disposed at the front traveling vehicle; wherein
the controller is configured or programmed to acquire a state of the front traveling vehicle based on the display manner captured by the imager through the mirror.

9. A traveling vehicle system comprising a plurality of the traveling vehicles according to claim 1.

10. The traveling vehicle system according to claim 9, further comprising a mirror located along the traveling path to reflect the display disposed at the front traveling vehicle; wherein
the controller is configured or programmed to acquire a state of the front traveling vehicle based on the display manner captured by the imager through the mirror.

* * * * *